United States Patent [19]

Popper

[11] 4,214,173

[45] Jul. 22, 1980

[54] SYNCHRONOUS BINARY COUNTER UTILIZING A PIPELINE TOGGLE SIGNAL PROPAGATION TECHNIQUE

[75] Inventor: Jay Popper, New York, N.Y.

[73] Assignee: Standard Microsystems Corp., Hauppauge, N.Y.

[21] Appl. No.: 883,285

[22] Filed: Mar. 3, 1978

[51] Int. Cl.² ............... H03K 21/34; H03K 23/30
[52] U.S. Cl. ........................... 307/224 C; 328/49
[58] Field of Search ......... 328/49; 307/223 R, 223 C, 307/225 R, 225 C, 224 C

[56] References Cited

U.S. PATENT DOCUMENTS

| | | | |
|---|---|---|---|
| 3,560,998 | 2/1971 | Walton | 307/225 C |
| 3,593,032 | 7/1971 | Ma | 307/224 C |
| 3,833,822 | 9/1974 | Carbrey | 307/225 C |
| 3,943,378 | 3/1976 | Beutler | 307/224 C |

*Primary Examiner*—John S. Heyman
*Attorney, Agent, or Firm*—Hopgood, Calimafde, Kalil, Blaustein & Lieberman

[57] ABSTRACT

A synchronous binary counter includes a plurality of counter stages wherein each stage experiences a state change in response to the application of a toggle signal thereto. Gating apparatus is provided between successive ones of the counter stages and said gating apparatus is responsive to a first state of the preceding counter stage for transferring the toggle signal to successive ones of the counter stages and responsive to a second state of the preceding counter stage for blocking the transfer of the toggle signal.

3 Claims, 2 Drawing Figures

SYNCHRONOUS BINARY COUNTER UTILIZING A PIPELINE TOGGLE SIGNAL PROPAGATION TECHNIQUE

FIELD OF THE INVENTION

This invention relates to synchronous binary counters and, more particularly, to a counter which utilizes a pipeline arrangement of transistors to propagate a toggle signal from the least significant bit of the counter up to the most significant bit of the counter.

DESCRIPTION OF THE PRIOR ART

Synchronous binary counters are well known in the art and are utilized in a great number of digital circuits. In order to implement a high-speed synchronous counter, (i.e., a counter with a frequency above two megahertz) a look-ahead toggle signal technique is required in which the toggle signal for each counter stage is produced in response to the logical "ANDING" of all lower order counter stage bits. More particularly, the nth stage of a binary counter will receive a toggle signal and experience a 1-to-0 or a 0-to-1 transition, if and only if, bits 0 through n−1 are at a logical "1" state when the clock signal is applied to a particular stage. Similarly, for a down counter, logical "0's" are required to be present in all lower order counter stages in order to produce a toggle signal.

IN MOS technology, high speed synchronous binary counters are most often implemented utilizing a two-phase clock (here-after referred to as $\phi_1$ and $\phi_2$. In this type of a binary counter a separate AND gate is required for each counter stage to provide the logical "ANDING" necessary to ensure that all lower order bits are in the logical "1" state before the toggle signal is produced for bit n. Utilizing an AND gate to sense the state of all lower order bits results in a heavy consumption of silicon area due to the number of AND gates required. For example, in a 10-state counter, eight logic gates, having 2 to 10 inputs, are required to implement a look-ahead toggle technique. In addition, the lower order stages must provide sufficient drive current to operate all higher order AND gates which results in a high fan-out requirement for the lower order stages. The high fan-out requirement results because each lower order stage must drive all higher order stages in a look-ahead counter, and therefore, all lower order stages must be buffered to boost their drive capability in order to insure that the AND gates which propagate the toggle signal are properly driven and transfer the toggle signal from the lower order stages to the higher order stages.

It is, therefore, an object of this invention to provide a high-speed synchronous binary counter which does not require a large number of AND gates in order to implement a look-ahead toggle signal technique.

It is a further object of this invention to provide a synchronous binary counter utilizing a look-ahead toggle signal technique that does not require buffering for the lower order stages.

It is a further and general object of this invention to provide a synchronous high-speed binary counter which consumes minimum silicon area while at the same time providing a look-ahead toggle signal technique to allow high-speed operation.

SUMMARY OF THE INVENTION

In accordance with the invention, a synchronous binary counter is provided which comprises a plurality of counter stages, each counter stage having a first output state and a second output state, and each counter stage experiencing a state change in response to a toggle signal applied thereto.

It is a feature of the invention that gating apparatus, connected between successive one's of the counter stages, is responsive to only the first state of the preceding counter stage for transferring a toggle signal applied to said preceding counter stage, to the next succeeding counter stage.

It is another feature of the invention that the gating apparatus is responsive to the second state of the preceding counter stage for blocking the transfer of the toggle signal from the preceding stage to the next succeeding counter stage.

It is a further feature of the invention that the gating apparatus, connected between successive stages, is responsive only to the state of the immediately preceding stage and does not require inputs from lower order stages, thereby allowing the gating apparatus to operate with minimum fan-out capability.

It is a further and general feature of the invention that utilizing gating apparatus in accordance with the instant invention allows the implementation of a high-speed synchronous binary counter which occupies a minimum amount of silicon area.

The foregoing and other objects and features of this invention will be more fully understood from the following description of an illustrative embodiment thereof taken in conjunction with the accompanying drawings.

DETAILED DESCRIPTION

Figure 1:
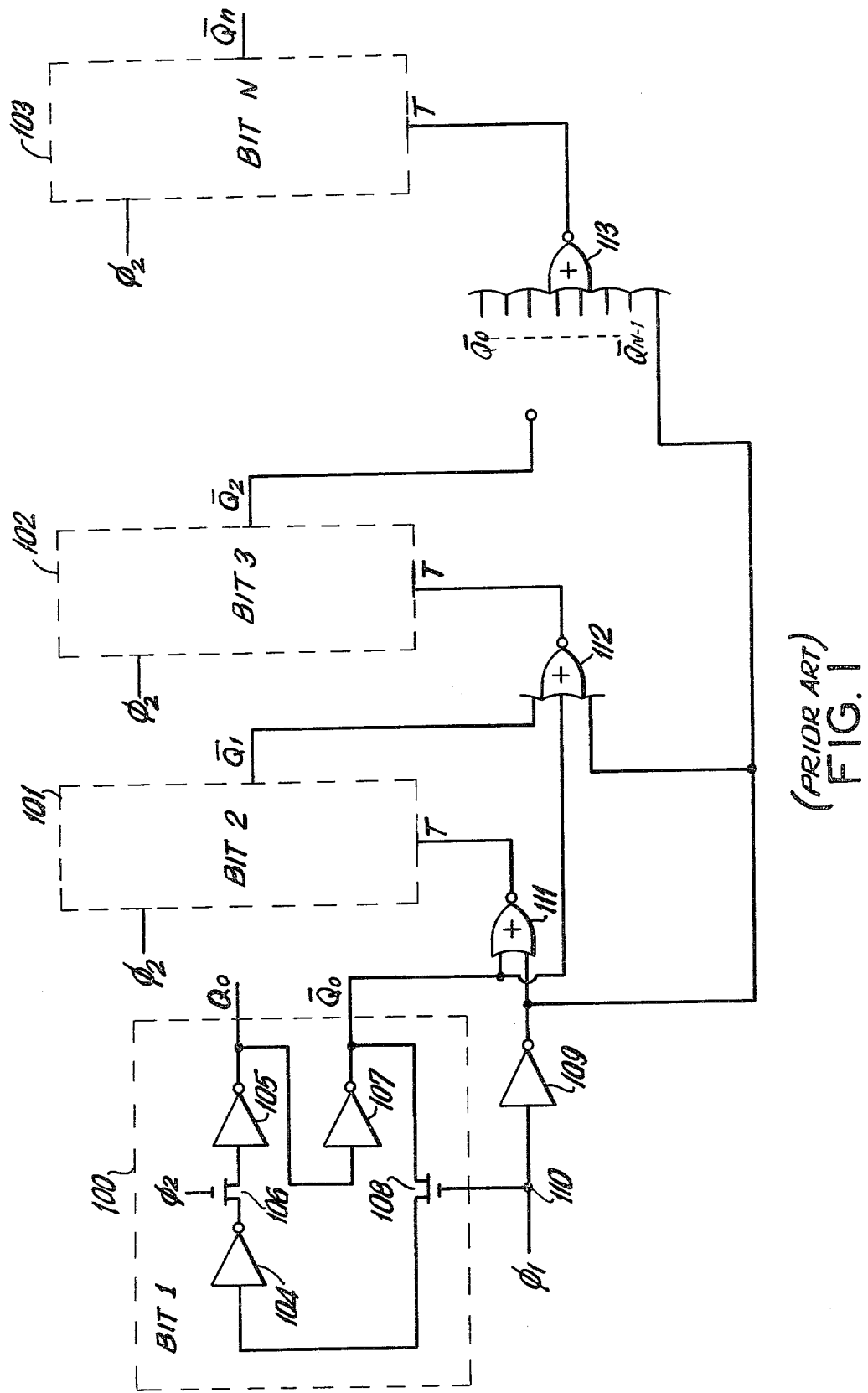
FIG. 1 illustrates a prior art synchronous binary counter.

Refer to FIG. 1 wherein is illustrated a block diagram of a prior art synchronous binary counter. The counter consists of a number of counter stages, such as counter stages 100 through 103. Each counter stage is identical to counter stage 100 which contains three MOS inverters, such as inverters 104, 105 and 107, and two MOS transistors, such as transistors 106 and 108. A toggle signal $\phi_1$ is applied to terminal 110 and from there to the gate of transistor 108 and to the input of inverter 109, and a clock signal $\phi_2$ is applied to the gate of transistor 106. Each counter stage has two output states, a true output state Q, and a complementary output state $\overline{Q}$, and each counter stage is designed to change state in response to a toggle signal and a clock signal applied thereto.

More particularly, assume that the output of inverter 107 is at a logical "1" level and the output of inverter 105 is at a logical "0" level. In response to toggle signal $\phi_1$, transistor 108 is enabled and transfers the logical "1" level present at the output of inverter 107 to the input of inverter 104, causing the output of inverter 104 to go to a logical "0" state. The subsequent application of clock signal $\phi_2$ to the gate of transistor 106 enables this transistor and transfers the logical "0" state present on the output of inverter 104 to the input of inverter 105, thereby causing the output of inverter 105 to go into a logical "1" state. This, in turn, forces the output of the inverter 107 to a logical "0" state, thereby accomplishing the state change recited above in response to the application of the toggle signal $\phi_1$ and the clock signal $\phi_2$.

For the counter illustrated in FIG. 1 to operate at high frequencies, (above two megahertz), it is necessary to utilize a look ahead technique for the propagation of the toggle signal from the first stage, stage 100, to subsequent higher order stages. Recall from what precedes that the toggle signal for each higher order stage should be applied thereto if the lower order stages are all in a logical "0" condition (the Q output being equal to a logical "1"). NOR gates 111, 112, and 113 will produce a logical "1" at their outputs if, and only if, all of the inputs to each gate are at a logical "0" condition. For example, assume that stage 100 is at a logical "1" state which results in the complementary output of stage 100 being at a logical "0" state. The application of the toggle signal to terminal 110 and from there to inverter 109 causes the toggle signal to be inverted, which applies a logical "0" to one input of gate 111. The remaining input of gate 111 is also at a logical "0" state as stage 100 has its Q output at a logical "1" state. Therefore, the output of gate 111 goes to a logical "1", which applies a toggle signal to stage 101 of the counter.

The sequence described above is also applicable to gate 112 which will produce a toggle signal if, and only if, stage 101 is in the true state, stage 100 is in a true state, and a toggle signal is applied to terminal 110. When these conditions are met a toggle signal is applied to stage 102 of the counter. It is clear from FIG. 1 that this same sequence is also applicable to each stage of the complete counter.

FIG. 1 illustrates the disadvantages inherent in such a prior art binary counter. The first disadvantage is that a large number of NOR gates are required, with each NOR gate requiring progressively higher numbers of inputs for use in the higher order stages of the counter. For example, NOR gate 113 requires n inputs, which, for a 20-stage counter, results in gate 113 requiring 20 inputs. Such a large number of inputs required for each gate and the large number of gates required results in a heavy consumption of silicon area when constructing a large binary counter or when putting a large number of binary counters on a single silicon chip. The second disadvantage illustrated in FIG. 1 is the fact that each lower order stage must drive all of the switching gates associated with all of the higher order stages. This requirement results in a high fan-out requirement for the lower order stages which, in turn, requires that each of the lower order stage outputs be buffered in order to boost their drive capability. This requires further active elements for each chip, which, in turn, consumes additional silicon area.

Figure 2:
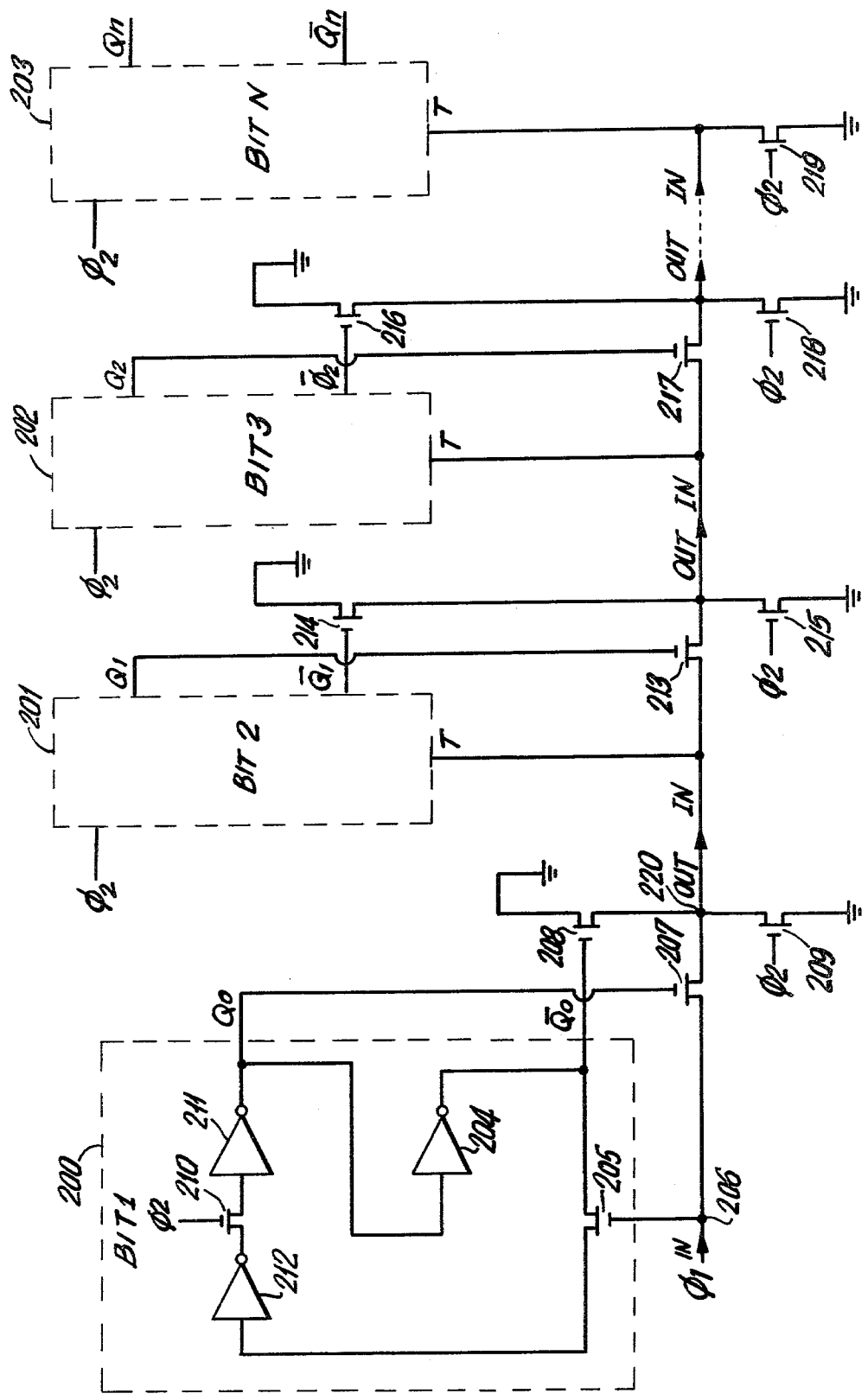
FIG. 2 illustrates a synchronous binary counter in accordance with the instant invention.

Refer to FIG. 2 wherein is illustrated the synchronous binary counter of the instant invention, which utilizes a pipeline technique for propagation of the toggle signals. The binary counter illustrated in FIG. 2 is similar to that described above in that the counter consists of a number of counter stages such as stages 200 through 203. Each stage, in turn, is identical to stage 200 and consists of inverters such as inverters 211, 212 and 204 and MOS transistors 205 and 210. Each stage has a true output (Q) and a complementary output ($\overline{Q}$) wherein the true output of counter stage 200 is the output of inverter 211 and the complementary output of counter stage 200 is the output of inverter 204.

Each counter stage shown in FIG. 2 operates in essentially the same manner as do the counter stages in FIG. 1. Assume that the $\overline{Q}_0$ output is at a logical "1" level, and that a toggle signal $\phi_1$ is applied to terminal 206. In response to the toggle signal, transistor 205 is enabled and transfers the logical "1" output of inverter 204 to the input of inverter 212, thereby making the output of inverter 212 go to a logical "0" state. Subsequent thereto, clock signal $\phi_2$ is applied to transistor 210, thereby enabling this transistor and applying the logical "0" at the output of inverter 212 to the input of inverter 211, which forces the output of inverter 211 to a logical "1". This, in turn, forces the output of inverter 204 to a logical "0", thereby changing the state of counter stage 200. Each of the counter stages 201 through 203 operate in an identical manner to that just described for counter stage 200.

Recall from what precedes that the prior art counter shown in FIG. 1 required a substantial number of logic gates, each having a plurality of inputs, in order to implement the look-ahead toggle signal technique. The counter of the instant invention does not require these logic gates and, therefore, provides many advantages over the prior art counter. More particularly, the toggle signal for the least significant bit of the counter (i.e. counter stage 200) is the $\phi_1$ toggle signal applied to terminal 206. Assume that counter stage 200 is at a logical "0" state such that the $Q_0$ output of stage 200 is at a logical "0" level. The $Q_0$ output being at a logical "0" level turns transistor 207 OFF, thereby preventing the toggle signal applied to terminal 206 from propagating through to higher counter stages. At the same time, $\overline{Q}_0$ is at a logical "1" level, thereby enabling transistor 208 which grounds junction 220, thereby insuring that the toggle signal is blocked from all successive stages. Therefore, transistor 207 in combination with transistor 208 prevents the propagation of the toggle signal to higher counter stages when the first counter stage is in a logical "0" state.

Assume now that counter stage 200 is in a logical "1" state, whereby the $Q_0$ output of counter stage 200 is at a logical "1". This level is applied to transistor 207 which turns this transistor ON. At the same time, the $\overline{Q}_0$ output of stage 200 is at a logical "0" level, thereby turning transistor 208 OFF. In this situation, the $\phi_1$ toggle signal is propagated through transistor 207, to junction 220, and is applied to the toggle input of stage 201, thereby allowing this counter stage to change logic state in response to the $\phi_2$ pulse being applied thereto. (The $\phi_2$ clock pulse occurs subsequent to the $\phi_1$ toggle pulse). The $\phi_2$ clock pulse is also applied to transistor 209, as indicated in FIG. 2, thereby turning this transistor ON and grounding junction 220. Transistors 209, 215, 218 and 219 are necessary to hold the toggle input of each counter stage at a logic "0" level while lower order bits are transitioning from one state to another. This requirement is necessary due to the fact that capacitive coupling between the stages could produce transient toggle signals at the time a lower order stage is changing state. Transistors 209, 215, 218 and 219 are also necessary to insure that there is no overlapping between the toggle signal $\phi_1$ and the clock signal $\phi_2$.

The operation described above for counter stage 200 is equally applicable to counter stages 201 through 203. More particularly, when the $Q_1$ output of counter stage 201 is at a logical "0" level, transistor 213 is turned OFF and transistor 214 is turned ON due to the $\overline{Q}_1$ output of stage 201 being at a logical "1" level. The combination of transistors 213 and 214 prevents the propagation of the toggle signal to higher order stages when stage 201 is in a logic "0" state. Alternatively, when the output of stage 201 is at a logic "1" level, the $Q_1$ output is high, thereby turning transistor 213 ON while transistor 214 is turned OFF. In this configuration the toggle signal applied to terminal 206, if it has been propagated through transistor 207 and junction 220, will also be propagated through transistor 213 and applied to the toggle input of stage 202. Similar to the operation described above, the occurrence of the $\phi_2$ clock pulse subsequent to the toggle pulse will turn on transistor 215, thereby grounding the toggle input of stages 201 and 202 while the lower order stages are changing state to thereby prevent transient toggle signals resulting from capacitive coupling between stages.

The circuit configuration described in FIG. 2 provides many advantages over the prior art configuration shown in FIG. 1. More particularly this "pipeline" configuration allows each stage output to have identical loading characteristics regardless of the length of the counter as each stage is required to drive an identical number of transistors. In addition, the pipeline transistors 207, 208 and 209 are easily incorporated within the structure of the counter stages during fabrication and each single cell of the counter stage can be repeated as often as desired to obtain the required counter length. This is in contrast to the conventional counter shown in FIG. 1, wherein the loading of each output stage varies from stage to stage as a function of the counter length. Thus, in a prior art counter, in order to achieve optimum design each stage must be designed individually and moreover, as the loading requirements increase for higher order stages, the devices incorporated within each stage must become larger, thereby using more circuit area. In addition, since the prior art stages are not identical, it is impossible to merely repeat identical cells and each cell must be designed individually which is an important disadvantage in large scale integration fabrication techniques. Through utilization of the "pipeline" configuration described above it has been shown that the toggle signal can be propagated through a ten-stage counter within 50 nsec. As the toggle signal frequency must be half of the clock signal frequency, a propagation time of 50 nanoseconds for a ten-stage counter is equivalent to a ten megahertz operation.

Although a specific embodiment of this invention has been shown and described, it will be understood that various modifications may be made without departing from the spirit of this invention.

I claim:

1. A synchronous, high speed binary counter, comprising a plurality of counter stages, each counter stage having a first output state and a second output state, each counter stage experiencing a state change in response to a toggle signal applied thereto and subject to transient toggle signals when a change of state signal is not applied thereto, means for applying the toggle signal to one of the counter stages, a first MOS device connected between successive ones of the counter stages, said device being responsive to the first state of the preceding counter stage for transferring the toggle signal applied to the preceding counter stage to the next succeeding counter stage and responsive to the second state of the preceding counter stage for blocking the transfer of the toggle signal, a second MOS device connected between the output of said first MOS device and ground and responsive to a non-toggle clock signal applied thereto for grounding any transient toggle signals to the counter stages, and a third MOS device also connected between the output of said first MOS device and ground and responsive to the second state of the preceding counter stage for grounding the toggle signal input to the next succeeding counter stage when said first MOS device is to be in said blocking condition.

2. A binary counter in accordance with claim 1 wherein each counter stage experiences a state charge in response to the application of the toggle signal thereto followed by the application of the clock signal thereto.

3. A binary counter in accordance with claim 2 wherein a counter stage and said first second and third MOS devices associated with the counter stage are incorporated in a single section of said binary counter, said binary counter having a plurality of identical sections.

* * * * *